(12) United States Patent
Hass

(10) Patent No.: US 9,951,630 B2
(45) Date of Patent: Apr. 24, 2018

(54) SELF-HEALING ENVIRONMENTAL BARRIER COATING

(71) Applicant: Directed Vapor Technologies International, Inc., Charlottesville, VA (US)

(72) Inventor: Derek Hass, Charlottesville, VA (US)

( * ) Notice: Subject to any disclaimer, the term of this patent is extended or adjusted under 35 U.S.C. 154(b) by 50 days.

(21) Appl. No.: 14/407,288

(22) PCT Filed: Jun. 12, 2013

(86) PCT No.: PCT/US2013/045370
§ 371 (c)(1),
(2) Date: Dec. 11, 2014

(87) PCT Pub. No.: WO2013/188516
PCT Pub. Date: Dec. 19, 2013

(65) Prior Publication Data
US 2015/0159492 A1    Jun. 11, 2015

Related U.S. Application Data

(60) Provisional application No. 61/658,672, filed on Jun. 12, 2012.

(51) Int. Cl.
*F01D 5/28* (2006.01)
*C23C 14/08* (2006.01)
(Continued)

(52) U.S. Cl.
CPC ............ *F01D 5/288* (2013.01); *C04B 35/571* (2013.01); *C04B 35/806* (2013.01);
(Continued)

(58) Field of Classification Search
None
See application file for complete search history.

(56) References Cited

U.S. PATENT DOCUMENTS

| 7,740,960 B1 * | 6/2010 | Zhu | C04B 35/185 |
| | | | 416/241 B |
| 2003/0138641 A1 * | 7/2003 | Fukudome | C04B 35/486 |
| | | | 428/446 |

(Continued)

OTHER PUBLICATIONS

International Search Report and Written Opinion for PCT/US13/45370, USPTO, dated Nov. 12, 2013.

*Primary Examiner* — Vera Katz
(74) *Attorney, Agent, or Firm* — Dale Jensen, PLC; Dale Jensen

(57) ABSTRACT

The present inventions incorporate self-healing mechanisms into current and future EBC systems. Such approaches have the potential to form environmental protection materials (i.e. thermally grown silicate compositions) in-situ to enable the ability to provide environmental protection to SiC based ceramics even in the event that cracks or voids form from within the EBC layer. In this disclosure, novel, self-healing EBC systems are disclosed along with coating synthesis techniques required to deposit the materials, microstructures and architectures. This research is anticipated to result in a thermal/environmental barrier coating system (T/EBC) that provides improved durability over current coatings. These advancements will aid the use of Si-based ceramics in a range of high temperature applications such a gas turbine engines and heat exchangers. These advances will not only benefit military engines, but also commercial and industrial engines requiring greater performance.

8 Claims, 6 Drawing Sheets

(51) Int. Cl.
  *C23C 14/10* (2006.01)
  *F01D 25/00* (2006.01)
  *C04B 35/571* (2006.01)
  *C04B 35/80* (2006.01)
  *C04B 41/89* (2006.01)
  *C04B 41/00* (2006.01)
  *C04B 41/52* (2006.01)
  *C23C 14/22* (2006.01)
  *C23C 14/30* (2006.01)

(52) U.S. Cl.
  CPC ............ *C04B 41/009* (2013.01); *C04B 41/52* (2013.01); *C04B 41/89* (2013.01); *C23C 14/08* (2013.01); *C23C 14/083* (2013.01); *C23C 14/10* (2013.01); *C23C 14/228* (2013.01); *C23C 14/30* (2013.01); *F01D 5/284* (2013.01); *F01D 25/005* (2013.01); *C04B 2235/5244* (2013.01); *C04B 2235/614* (2013.01); *C04B 2235/616* (2013.01); *F05D 2300/6033* (2013.01)

(56) References Cited

U.S. PATENT DOCUMENTS

| | | | |
|---|---|---|---|
| 2003/0138672 A1* | 7/2003 | Bauer | C04B 41/009 428/698 |
| 2005/0170200 A1* | 8/2005 | Nagaraj | C23C 4/10 428/633 |
| 2006/0073361 A1* | 4/2006 | Fukudome | C04B 35/16 428/698 |
| 2010/0136349 A1* | 6/2010 | Lee | C04B 41/009 428/446 |

* cited by examiner

SELF-HEALING ENVIRONMENTAL BARRIER COATING

BACKGROUND

Lightweight silicon-based ceramics are leading candidates to replace heavier nickel-based superalloys for hot section components used in advanced gas turbine engines having increased specific power. Unfortunately, exposures of these materials to the high temperature combustion environments alter the effectiveness of thermally grown silica scales in providing protection from oxidation and component recession during service. Environmental barrier coatings (EBCs) are therefore required that protect the underlying ceramic substrate from environmental attack. Such coatings require good stability in the presence of water vapor, a mechanism for limiting oxygen/water vapor transport and high temperature phase stability. The nature of the silicon-based ceramic recession issue dictates that any EBC system must provide prime reliant performance to ensure full component lifetimes.

DRAWINGS

FIG. 1—Schematic illustrations showing potential self-healing coating architectures. In A) a two-phase, self-healing coating approach is given in which a secondary sealing material consists of the minority, non-continuous phase. In B) an alternating approach is shown. In this case, one layer type would consist of a functional material (i.e. bond coat or environmental barrier) and the second layer type would provide self-healing protections (i.e. in-situ formation of rare-earth silicate scales).

FIG. 2—Schematic illustration showing the architecture of current generation plasma sprayed environmental barrier coatings.

FIG. 3—Potential advanced impact/erosion resistant concept to be considered for incorporation during the potential Phase I, Phase I option and Phase II program phases. Concepts shown include a) impact crack deflection layers, b) impact crack initiation deterrent layer and c) energy absorbing layers.

FIG. 4—A) Schematic illustration of the DVD system. This approach has been used to manufacture B) dense silicate layers and C) fine alternating multilayer coatings (7YSZ/SiO2).

FIG. 5—SEM micrographs showing the microstructure of DVD deposited T/EBC systems. In a) a Gd2Zr2O7/EBC/SiC system is shown and in b) a YSH/EBC/SiC system is shown.

FIG. 6—SEM micrographs showing the microstructure of DVD deposited T/EBC systems following exposure in high steam thermal cycle rig (100 hr; 90% water vapor; 1316° C.). In a) a Gd2Zr2O7/EBC/SiC system is shown and in b) a YSH/EBC/SiC system is shown.

FIG. 7—Comparison of a 500 ⌀ m thick DVD deposited T/EBC coating and a 525 ⌀ mm thick plasma sprayed T/EBC coating following a 300 m/sec., ambient temperature impact of a ⅟₁₆" steel ball. Note that a significantly larger portion of the DVD T/EBC remains intact following the impact.

FIG. 8—Schematic illustration showing a potential architecture for a substrate integrated, self-healing T/EBC system. The proposed system would include an initial layer of a rare earth silicate forming SiC layer which also acts as a sealing layer for the SiC/SiC composite and an alternating layer bond coat and EBC layer which using modified SiC layers to promote self-healing behavior for these layers. An impact and CMAS resistant thermal barrier acts as the top coat.

FIG. 9—Digital image of the DVTI's new production scale DVD system.

FIG. 10—A) Digital image showing the co-evaporation of two 1" diameter YSZ source rods using the PS-DVD system. B) Dual source set-up showing e-beam heating of two source rod materials (center) and zirconia gravel (exterior) to enable co-evaporation of two materials and radiant heating of a substrate.

DETAILED DESCRIPTION

To help meet this goal, approaches to incorporate self-healing mechanisms into current and future EBC systems are of high interest. Such approaches have the potential to form environmental protection materials (I.e. thermally grown silicate compositions) in-situ to enable the ability to provide environmental protection to SiC based ceramics even in the event that cracks or voids form from within the EBC layer. Self-healing EBC systems provide for development along with coating synthesis techniques to deposit the materials, microstructures and architectures. This research results in a thermal/environmental barrier coating system (T/EBC) that provides improved durability over current coatings. These advancements aid the use of Si-based ceramics in a range of high temperature applications such a gas turbine engines and heat exchangers. These advances benefit military engines, as well as commercial and industrial engines requiring greater performance.

Silicon Based Ceramic Matrix Composites: Silicon-based ceramic matrix composite (CMC) materials are the leading candidates to replace nickel-based and other turbine components in next generation gas turbine engines due to their potential weight and performance benefits. Such benefits are primarily due to their high melting points, relatively low density, high toughness relative to other ceramic materials and excellent oxidation resistance in clean oxidizing environments due to the formation of a protective, slow-growing silica scale. The improved toughness of these materials relative to other ceramic materials is controlled primarily by the presence of fiber/matrix interface (or interphase) regions between the ceramic fibers and matrix. A relatively weak interphase region which promotes fiber/matrix debonding and crack deflection is desired, however, the interphase must still also remain strong enough for load transfer as required in any fiber-reinforced composite.

To meet the sensitive needs of the interphase, methods to engineer the properties of this region of CMC's have been developed. They include the in-situ formation of a relatively weak interphase via a chemical reaction between the fiber and matrix during composite processing and the use of pre-coated fibers which yield the desired properties. However, efforts to engineer the interphase are complicated by property changes that can occur during environmental exposure (i.e. oxidation) of the CMC. Oxidation of the interphase can alter its properties thus affecting the mechanical performance of the composite material. The oxidation of these internal regions of CMC components are promoted by porosity in the CMC matrix and matrix micro-cracks which can form during service. Thus, approaches which lead to CMC's which are sealed to the outside environment are critical to long term performance.

The processing of silicon-based CMCs is a multi-step process which typically consists of a lay-up step where pre-forms of fibers are shaped into the required geometry, infiltration of the matrix into the preform, and as some cases the application of an outer sealing layer of matrix material followed or preceded by a final machining step to result in the finished shape. Most commonly, the matrix infiltration step is achieved using a chemical vapor deposition based approach termed chemical vapor infiltration (CVI) as the vapor infiltrates into the fiber preform to build up matrix material between the fibers. The use of polymer based precursors that can be infiltrated into the preform is another useful approach for creating matrix material. Typically termed polymer infiltration and pyrolysis (PIP), this approach requires many infiltration and pyrolysis steps to achieve the desired matrix density due to the shrinking the precursor during pyrolysis. An outer layer of SiC is then often deposited around the SiC/SiC composite component to provide a dense outer layer of matrix material which can to prevent the internal oxidation of the matrix/fiber interphase.

Efforts to further prevent interphase oxidation have also traditionally employed self-sealing (or healing) matrices. For example, the introduction of borosilicate or boron carbide phases into the CMC matrix that can act to absorp oxygen and for flow into open pores or cracks during high temperature exposure can greatly improve CMC performance in oxidizing environments. However, in applications where lower temperature exposures (<2000° F.) are experienced the self-healing mechanisms become less effective. In addition, exposure in water vapor environments can also lead to selective volatilization of the self-healing phases to further limit their benefit.

Environmental Barrier Coatings: While SiC based CMC materials have a range of advantageous properties, the exposures of these materials to the high temperatures, pressures and velocities of water vapor containing combustion environments alter the effectiveness of the protective silica scale which naturally forms on the SiC matrix. Such conditions result in the formation of hydrated silica species $(Si(OH)_x)$ and volatilization of the protective scale. This results in decreased protection and rapid ceramic recession of these materials during service. This issue has driven the ongoing development of multi-layered environmental barrier coatings (EBC) to prevent ceramic recession and also provides thermal protection to the components. EBCs are coating systems that are applied to the surface of Si-based ceramics resulting in protection against moisture-assisted oxidation-induced ceramic recession. These coatings require many attributes to be successful including; good stability in the presence of water vapor, a mechanism for limiting the transport of oxygen and water vapor to the ceramic substrate, good chemical compatibility at the interface of unlike materials, high temperature phase stability to limit volume changes resulting from phase transformations in the coating materials and the ability to provide thermal and impact/erosion protection to the underlying CMC substrate. The success of prior EBC work has indicated the feasibility of incorporating ceramic components into current and future engine designs; however, several key coating challenges remain including higher temperature capability and prime reliance (especially in the presence of impact/erosion/corrosion conditions). At temperatures above 11000° C. in a combustion environment, the SiC-SiC components cannot tolerate even local spallation of the EBC layer without damage to the underlying component as the water vapor can then locally attack the protective silica scale which thermally grows on the SiC surface. As a result, EBC systems are prime reliant. This requirement indicates that not only is protection against ceramic recession in a moisture environment provided, but that is it retained in the presence of particle impact, erosion and corrosion (molten sand, CMAS). Despite their demonstrated success, current state-of-the-art EBC systems (silicon bond coat/mixed mullite+BSAS layer/BSAS top layer), have also been shown to be highly susceptible to foreign object damage (FOD) and erosion attack. As a result, advanced EBC systems are sought which retain the environmental protection afforded during long time exposures in combustion atmospheres.

One key component of the development of prime reliant EBC systems is the incorporation of self-healing concepts into either T/EBC systems or the underlying CMC matrix or both. Progress in the development of self-healing SiC matrices for SiC/SiC CMC's has been made in which composition modifications to SiC have been developed that lead to the in-situ formation of rare-earth silicate layers that can provide some amount of environmental protection against the regression of the CMC matrix. Such compositional modifications are envisioned to be incorporated into the outer sealing layer of the CMC composite provided the required modifications to the CVD processing approach can be achieved. Compositions of interest in this case are generally SiC based with additions of specifically designed amounts of silicides, oxides and/or borides.

Self-Healing Coating Concepts: Self-healing concepts which can be incorporated directly into T/EBC systems offer an additional means to aid to development of prime reliant EBC systems. Potential approaches include the use of coating compositions consisting of two or more phases or composite films consisting of thin, alternating layers, as illustrated in FIG. 1. For the two-phase coating approach, of particular interest is the formation of a highly durable continuous phase having one or more lower melting point, secondary materials dispersed as secondary phases throughout the continuous phase. The low melting point minority phase material can then act to heal cracks and defects if the viscosity is sufficiently low in the anticipated temperature range. Given that the desired set of individual phase properties can be achieved, this approach offers the potential to achieve self-healing properties at relatively low temperatures while still allowing use at higher temperatures (without coating volatilization or excessive softening). Approaches of this generally type have already been demonstrated to be feasible as protective coatings for nickel based superalloys. Multi-layered coating approaches potentially have more utility as alternating layers of, for example, EBC materials and self healing matrix materials offer the opportunity to not only provide material to fill cracks incurred during service, but can also be designed to form protective rare-earth silicate layers in the damaged area. This means that the newly formed material should also be able to provide environmental protection and have good high temperature stability. In addition, such structures may also generally improve the impact resistance of the EBC due to the layered architecture.

FIG. 1 provides schematic illustrations showing potential self-healing coating architectures. In FIG. 1A) a two-phase, self-healing coating approach is given in which a secondary sealing material consists of the minority, non-continuous phase. In FIG. 1B) an alternating approach is shown. In this case, one layer type would consist of a functional material (i.e. bond coat or environmental barrier) and the second layer type would provide self-healing protections (i.e. in-situ formation of rare-earth silicate scales).

EBC Processing: The development of the processing techniques to enable the incorporation of the advanced concepts given above an important step for their use in next generation T/EBC systems. To be successful, processing techniques provide for the ability to: deposit high quality films at high rates to enable thick films of the required compositions and architectures (such of the CMC sealing layer) in an affordable manner; have the ability to control the composition and microstructure of individual layers; and be able to apply complex multi-layered coating systems in an affordable single processing sequence.

Traditionally, the processing of the outer CMC sealing layer has occurred by a final CVD deposition step of a relatively thick outer SiC layer (~6 to 8 mils). T/EBC systems have been applied using plasma spray approaches. In the PS process, coatings are created by the repeated impingement of semi-molten particles onto a substrate which results in a semi-dense coating having elongated pores in the plane of the substrate. This porosity, along with the occasional presence of unmelted particles, can result in highly defected coatings having poor mechanical strength. In using this process for EBC deposition, care must also be taken to limit the formation of metastable amorphous phases which can detrimentally affect coating performance during their transition into the stable crystalline phase. Another issue is frequently the adherence of the PS layers which results primarily from mechanical bonding which is enhanced by high surface roughness. Improved adherence is often desired between the ceramic substrate and PS coatings or between multiple PS layers. Such interfaces are typically the weak links in plasma sprayed EBC systems.

Nevertheless, the plasma spray approach has been found to be an effective technique to applying current generation T/EBC systems, FIG. 2. FIG. 2 provides a schematic illustration showing the architecture of current generation plasma sprayed environmental barrier coatings.

However, the layers are particularly prone to impact damage (see FIG. 7 below) and the microstructures obtained using this technique are not well suited for the microstructures and architectures of advanced T/EBC designs which are being developed for enhanced energy absorption and impact resistance, as illustrated in FIG. 3. FIG. 3 provides potential advanced impact/erosion resistant concept to be considered for incorporation during the potential Phase I, Phase I option and Phase II program phases. Concepts shown include a) impact crack deflection layers, b) impact crack initiation deterrent layer and c) energy absorbing layers.

In addition, the possibility also exists to Integrate the T/EBC system with the CMC sealing layer in order to better optimize the performance of both layers, minimize the thickness and there weight debit of these layers for rotating components and to minimize the processing cost of the entire CMC/EBC system. In this case, deposition approaches which are well suited for the creation of an integrated, self-healing coating system that acts as both an outer sealing layer for the CMC, a prime reliant EBC and also provides thermal protection to the component offers the potential to greatly improve the current state-of-the-art.

EBC deposition approaches utilize not only control of the desired material composition but also the ability to manipulate the coating architecture, microstructure, adhesion and crystallinity. High rate processes which enable thick coatings to be deposited at low cost are also required, especially those which can deposit layers onto complex components having non line-of-sight regions (NLOS). One approach for obtaining some of the above goals is the use of physical vapor deposition (PVD) approaches. Such approaches are of interest for several reasons:

The adhesion of PVD layers is primarily due to chemical bonding which can enable enhanced adhesion over mechanically bonded layers. This could create the potential to deposit well adhered EBC layers without the need for a Si bond coat that may otherwise require replacement for EBCs with enhanced temperature capability.

Atomistic deposition approaches such as PVD can also enable both very dense films and layers having porosity with controlled morphologies. In thermal barrier coating (TBC) applications, the microstructures created via PVD have been demonstrated to have greatly improved strain tolerance and erosion resistance over plasma sprayed layers of the same composition. The ability to manipulate the pore volume and morphology in vapor deposited layers enables the creation of engineered coatings having, for example, a relatively thin, dense and highly adherent EBC layer followed by a thicker, strain tolerant thermal barrier with a columnar microstructure.

Despite these advantages, conventional PVD approaches are generally limited for EBC applications. This is due to the low deposition rates (i.e. with sputtering based approaches) which make thick film deposition unfeasible or the poor compositional control of thermal evaporation based PVD processes that results when complex materials having a wide range in vapor pressure between material components (such as is often found for rare earth silicate compositions) are evaporated. The ability to deposit onto complex components having NLOS regions is also of interest. As a result, advanced PVD approaches which retain the key advantages of PVD approaches, but enable enhanced deposition rates, compositional control and NLOS coating are sought to advance current state-of-the-art EBC's.

Directed Vapor Deposition: Directed vapor deposition (DVD), is an advanced approach for vapor depositing high quality coatings onto complex substrates, FIG. 4(*a*). It was initially developed at the University of Virginia and is licensed to DVTI, Inc. It provides the technical basis for a flexible, high quality coating process capable of atomistically depositing dense or porous, compositionally controlled coatings onto line-of-sight and NLOS regions of components. Unlike other PVD approaches, DVD is specifically designed to enable the transport of vapor atoms from a source to a substrate to be highly controlled. To achieve this, DVD technology utilizes a supersonic gas jet to direct and transport a thermally evaporated vapor cloud onto a component. Typical operating pressures are in the 1 to 50 Pa range requiring that only fast and inexpensive mechanical pumping need be used resulting in short (few minutes) chamber pump-down times. In this processing regime, collisions between the vapor atoms and the gas jet create a mechanism for controlling vapor transport. This enables several unique capabilities:

High Rate Deposition: Vapor phase collisions between the gas jet and vapor atoms allow the flux to be "directed" onto a substrate. Since a high fraction of the evaporated flux impacts the substrate (i.e. the materials utilization efficiency is increased) instead of undesired locations (such as the walls of the vacuum chamber) a very high deposition rate (>10 µm min$^{-1}$) can be obtained.

Non Line-of-Sight Deposition: The gas jet can be used to carry vapor atoms into internal regions of components and then scatter them onto internal surfaces to result in NLOS deposition.

Controlled Intermixing During Multiple Source Evaporation: The use of high frequency e-beam scanning (100 kHz) allows multiple source rods to be simultaneously evaporated. By using binary collisions with the gas jet atoms, the vapor fluxes are intermixed allowing the composition of the vapor flux (and thus, the coating) to be uniquely controlled. This allows alloys with precise compositional control to be created even when large vapor pressures difference exist between the alloy components. It also enables multilayered coatings to be deposited in a single run.

FIG. 4A provides schematic illustration of the DVD system. This approach has been used to manufacture FIG. 4B dense silicate layers and FIG. 4C fine alternating multilayer coatings (7YSZ/$SiO_2$).

It has also been shown that hollow cathode plasma activation can be used to improve the density and crystallinity of DVD layers if required. This enables a large percentage of all gas and vapor species to be ionized. The ions can then be accelerated towards the coating surface by an applied electrical potential increasing their velocity (and thus the kinetic energy) and thus, allowing the coating density and potentially the crystallinity to be increased. These characteristics combine to make DVD both a useful tool for the development of new EBC compositions and as a next generation deposition approach for these coatings and also potentially for the outer sealing layer of the CMC matrix.

Environmental Barrier Coating Application Via DVD: The DVD approach has demonstrated the ability to create dense EBC layers and also to combine them with columnar thermal barriers for the creation of novel T/EBC systems. DVD deposited T/EBC systems have been demonstrated to be effective as environmental barriers in steam containing environments and also show promise as a means for creating for impact resistant T/EBC systems, FIGS. 5-7.

Self-Healing T/EBC Development: In this work, novel DVD processing techniques are used to create an integrated, self-healing coating system for SiC/SiC CMC's that provides environmental protection to the underlying substrate, FIG. 8. The goal is to aid the development of a prime reliant coating system for can not only survive high temperature combustion environments, but it also well suited to remain protective following the impact of foreign particles and molten sand (i.e. CMAS). The approach consists of a three part coating system. The first part acts as a self-healing sealing layer designed to form an in-situ rare earth silicate layer upon exposure of the layer to an oxidizing environment. This layer prevents internal oxidation of the fiber matrix interphase. The second part is a bond coat/environmental barrier layer to provide protection from the combustion environment. This set of layers, in one embodiment, consists of alternation layers of first Si and a self-healing SiC based composition and then a silicate based EBC layer and a self-healing SiC based composition. The resulting set of layers have a high relative toughness and the ability to form rare-earth silicate layers in any cracks or defects that may form during service. The third part is an impact and CMAS resistant thermal barrier which aims to limit the ingress of high temperature, high velocity combustion gases to the EBC surface as well as protecting it from foreign objects that may result in impact and/CMAS damage. The use of energy adsorbing layers and dense interlayers prevents impact and CMAS related damage.

Figure 1A:
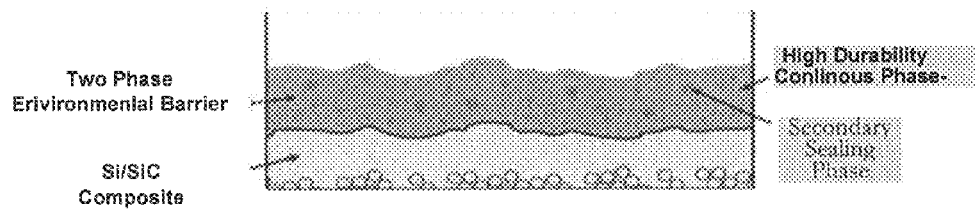
Figure 1B:
Figure 2:
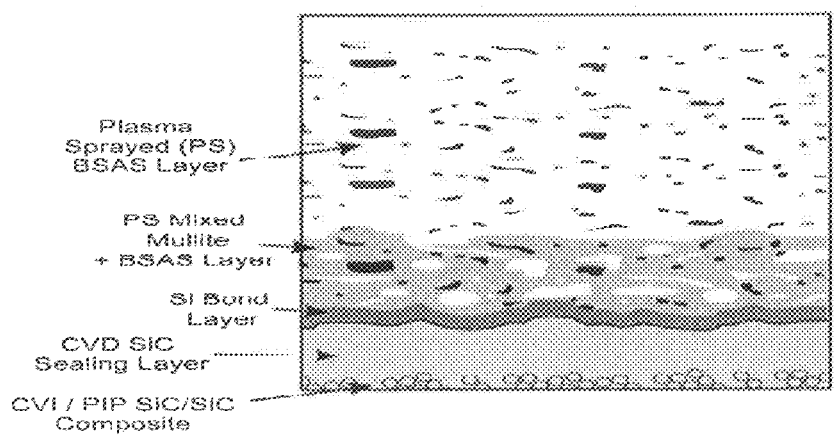
Figure 3A:
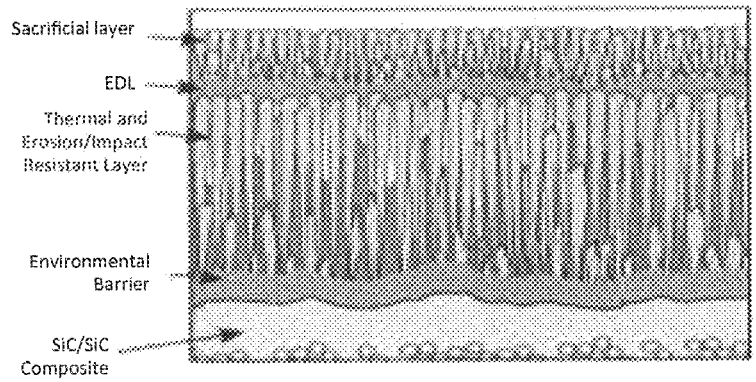
Figure 3B:
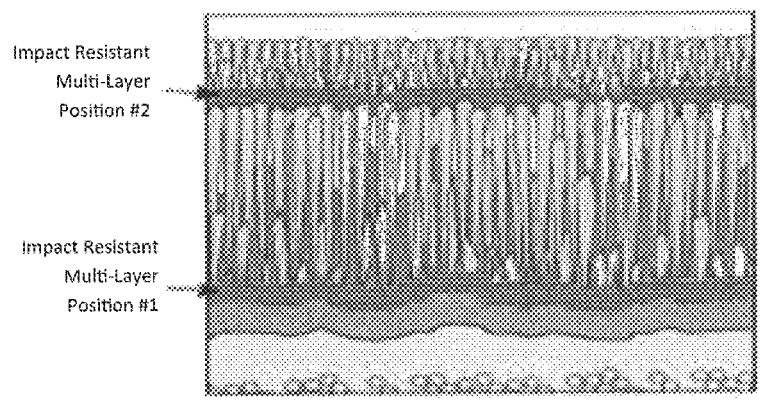
Figure 3C:
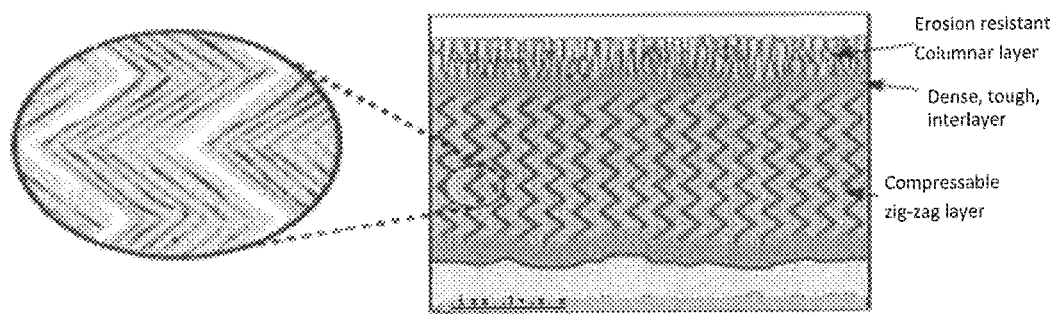
Figure 4A:
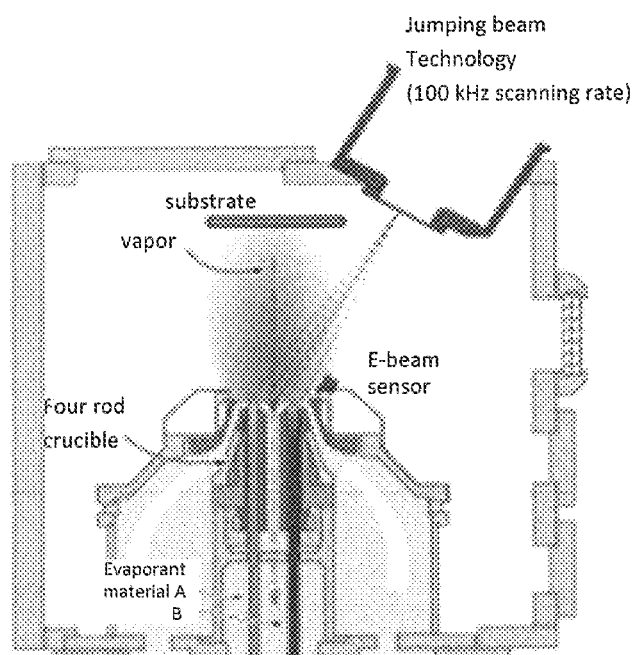
Figure 4B:
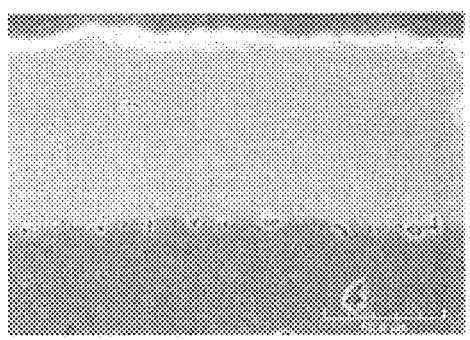
Figure 4C:
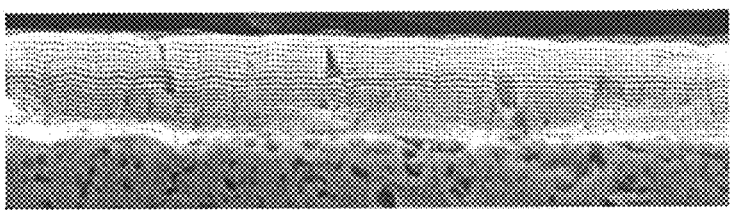
Figure 5A:
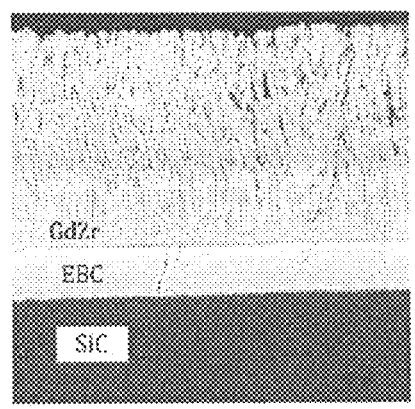
FIG. 5A illustrates SEM micrographs showing the microstructure of DVD deposited T/EBC systems. In a) a $Gd_2Zr_2O_7$/EBC/SiC system is shown and in FIG. 5B a YSH/EBC/SiC system is shown.
Figure 5B:
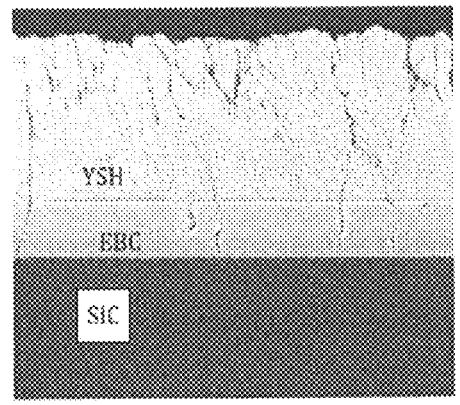
Figure 6A:
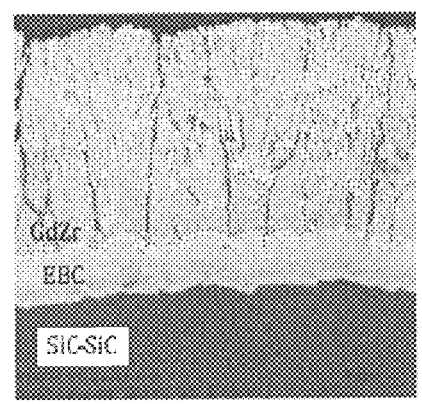
In FIG. 6A a $Gd_2Zr_2O_7$/EBC/SiC system is shown and in FIG. 6B a YSH/EBC/SiC system is shown.
Figure 6B:
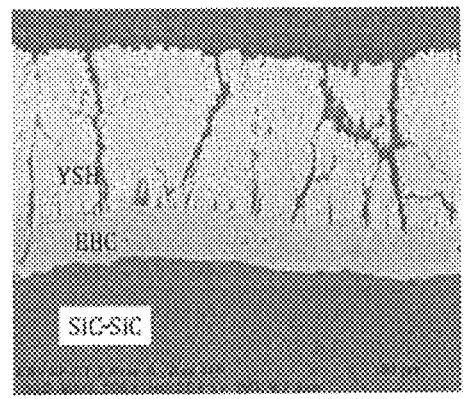
FIG. 6 illustrates SEM micrographs showing the microstructure of DVD deposited T/EBC systems following exposure in high steam thermal cycle rig (100 hr; 90% water vapor; 1316° C.).
Figure 7A:
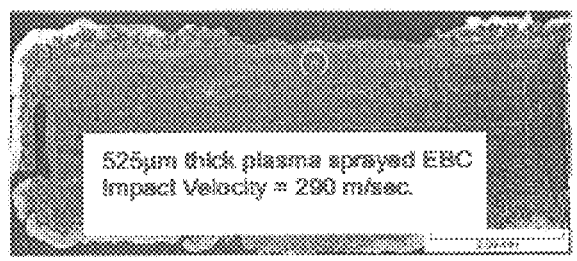
FIG. 7 illustrates a comparison of a 500 µm thick DVD deposited T/EBC coating and a 525 µm thick plasma sprayed T/EBC coating following a 300 m/sec., ambient temperature impact of a 1/16" steel ball. Note that a significantly larger portion of the DVD T/EBC remains intact following the impact.
Figure 7B:
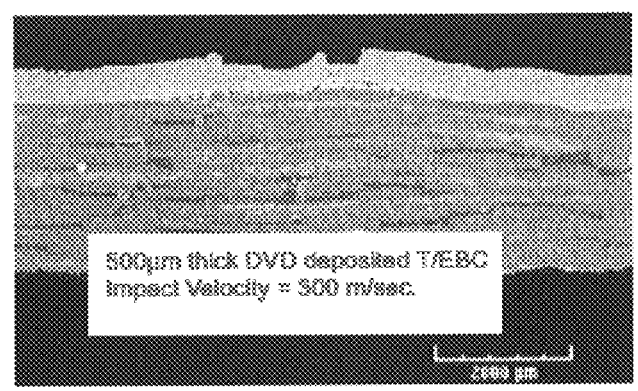
Figure 8:
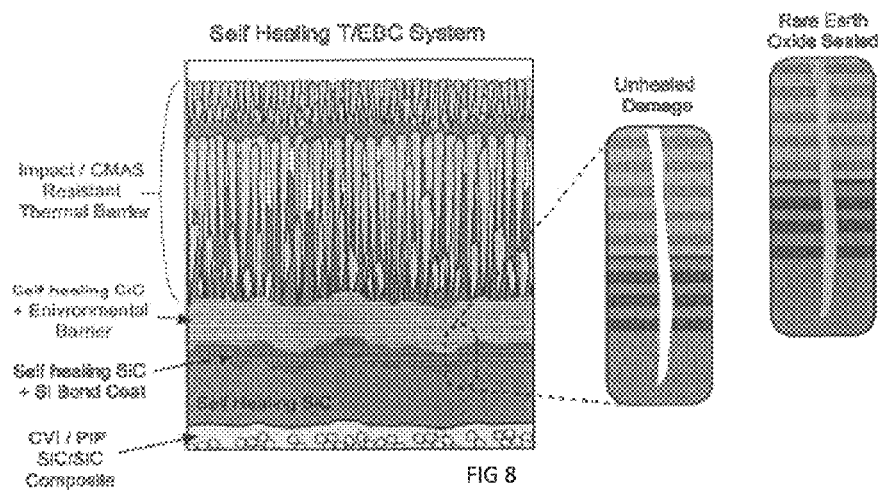

FIG. 8 provides schematic illustration showing a potential architecture for a substrate integrated, self-healing T/EBC system. The proposed system would include an initial layer of a rare earth silicate forming SiC layer which also acts as a sealing layer for the SiC/SiC composite and an alternating layer bond coat and EBC layer which using modified SiC layers to promote self-healing behavior for these layers. An impact and CMAS resistant thermal barrier acts as the top coat.

In this embodiment, a novel self-healing T/EBC system can be applied directed onto the surface of a CVI or PIP manufactured SiC/SiC composite component. The architecture proposed takes advantage of advanced SiC compositions which can form rare-earth silicates in-situ. A key aspect of this work is the parallel development of processing techniques to enable an effective, affordable manufacturing approach for these systems.

A major aspect of this work is the development of a deposition process for modified SiC compositions. The approach will be to use a multiple source directed vapor deposition technique. One source will evaporate a SiC source and the second a selection of secondary oxide and boride compositions to enable a composite composition required for self-healing capability (single source deposition may also be possible for some compositions). Multi-source evaporation in DVD is enabled by the use of advanced e-beam gun technology having high speed e-beam scanning (up to 100 kHz) and a small beam spot size (<0.5 mm). This allows multiple crucibles placed in close proximity to one another to be precisely heated and the source material evaporated. The carrier gas surrounds the vapor sources and allows the vapor from the neighboring melt pools to inter-diffuse. By altering the electron beam scan pattern to change the temperature (and thus the evaporation rate) of each source material the composition of the deposited layer can then be controlled. In effect this is a splitting of the beam into two or more beams with precisely controllable power densities. As a result, the DVD system enables the evaporation of several materials simultaneously. Process conditions have been identified that lead to very good mixing between the vapor fluxes of the different melt pools leading to a uniform coating composition across the substrate. This intermixing is due to the closely spaced melt pools and vapor phase collisions that allow lateral diffusion of vapor atoms.

Following the creation of the self-healing layer a similar deposition set-up can then be used of created multi-layered bond coat and environmental barrier structures which consist of alternating layers of the chosen materials (for example, bond coats may consist of Si and modified SiC layers and the EBC may consist of rare earth silicates and modified SiC layers). By alternating the evaporation from one set of sources to another and back, many alternating layers can be created in each deposition sequence to enable the efficient manufacture of such structures in a cost effective manner. The layered structures are of interest to aid the formation of thermally grown rare earth oxide layers in defected regions of the EBC and bond coat. A final set of layers would then be applied onto the EBC layer to provide thermal, impact and CMAS protection. Such layers are under development in parallel efforts.

Figure 9:
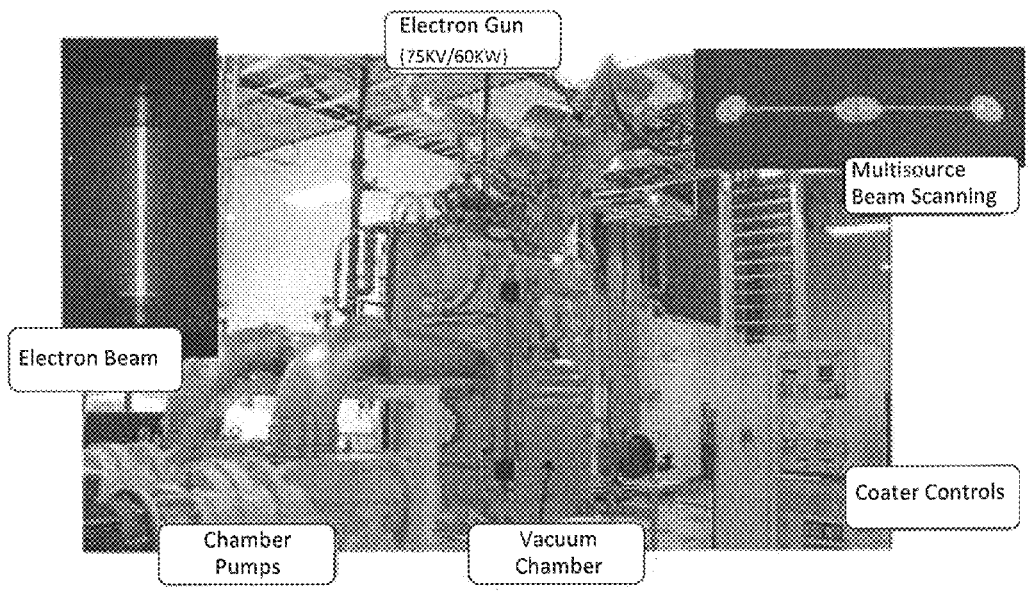

All coatings in the proposed in this work will be created using DVTI's production scale DVD coater. The use of multiple source rod evaporation theis coater is shown in FIG. 9 where co-evaporation of two 1" diameter source rods is shown. The system is equipped with an advanced 60 kW e-beam gun that has a high accelerating voltage (75 kV) to enable the use of elevated chamber pressures (up to 33 Pa), extremely large+/−30° beam deflection angles and very high (>10 KHz) scanning frequencies. These attributes enable evaporation from crucibles placed at most any point on the interior of chamber. To take advantage of this, the crucible/nozzle apparatus allows for the crucible-to-crucible spacing to be easily adjusted. This spacing along with the supersonic gas jet nozzle geometry controls the achievable deposition area, its vapor density and finally the maximum throughput during production scale coating. Pre-heating of the substrates will occur by scanning the e-beam across regions of the DVD crucible/nozzle apparatus covered with zirconia to result in heating of the zirconia and radiant heating of the substrates, FIG. 10. The production scale coater will also be equipped with a magnetically enhanced hollow cathode plasma activation system in the $4^{th}$ quarter of 2011. This system uses a pair of plasma emitters coupled together in a pulsed mode to provide large area plasma activation of multiple vapor plumes. The system is capable of dissipating up to 20 kW of power (200 A, 100V). The plasma system will also be equipped with electrical bias control to provide a DC positive or negative charge, or an AC charge to the substrate.

FIG. 9 illustrates a digital image of one embodiment a new production scale DVD system providing for the functionality described herein.

Figure 10A:
Figure 10B:
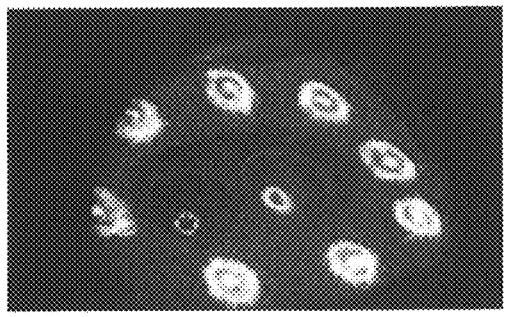

FIG. 10A illustrates a digital image showing the co-evaporation of two 1" diameter YSZ source rods using the PS-DVD system. FIG. 10B Illustrates a dual source set-up showing e-beam heating of two source rod materials (center) and zirconia gravel (exterior) to enable co-evaporation of two materials and radiant heating of a substrate.

Potential Benefits of the Proposed Technology: The development of an advanced, self-healing T/EBC system using DVD processing will enable not only a T/EBC system that will meet the needs of engines used in future military platforms, but also a new deposition process to enable the affordable creation of these coatings onto current and advanced engines parts. The concepts used here are innovative as they allow for the development of a new coating system that is enabled by the advanced processing capabilities of the DVD technique. DVD coaters are envisioned to be small with low capital costs and a tailorable volume so that moderate volumes of parts can still be deposited at low cost or as larger, high throughput systems having enhanced cost effectiveness. The soft vacuum required and the high deposition rates of DVD have the potential to facilitate assembly line like part coating for some geometries. These features also enable quick and easy repair options at repair depots since parts can be placed into the deposition chamber and quickly coated (as pump down times and deposition rates are short) and a single piece of equipment could be used deposit the entire coating system in a single step. The non line-of-sight capabilities of this approach enable coatings to be deposited onto the interior hidden regions of complex components thus expanding their use. The compositional and morphological flexibility of this approach would also enable other advanced functional coating systems to be applied.

What is claimed is:

1. A self-healing coating deposited on a SiC ceramic matrix composite substrate, the self-healing coating comprising:
    a self-healing SiC based section that forms an in-situ rare earth silicate layer upon exposure to an oxidizing environment;
    a silicate based environmental barrier section that provides a barrier between the SiC ceramic matrix composite and a combustion environment;
    an impact and CMAS resistant thermal barrier coating section having a columnar microstructure that limits ingress of combustion cases to a surface of the environmental barrier section;
    wherein at least one of the sections comprises a multilayer coating architecture.

2. The self-healing coating of claim 1 wherein the multilayer coating comprises alternating thin layers having different phases and wherein at least one layer is an EBC layer and wherein at least one of the other layers is self-healing.

3. The multilayer coating of claim 2 wherein at least one of the thin layers forms rare-earth silicate scales during self-healing.

4. The multilayer coating of claim 2 wherein the thin layers act as a barrier to erosion of the ceramic matrix composite substrates.

5. The self-healing coating of claim 1 wherein the multilayer coating comprises alternating thin layers having different compositions and wherein at least one layer is an EBC layer and wherein at least one of the other layers is self-healing.

6. The multilayer coating of claim 5 wherein at least one of the thin layers forms rare-earth silicate scales during self-healing.

7. The multilayer coating of claim 5 wherein the thin layers act as a barrier to erosion of the ceramic matrix composite substrates.

8. The self-healing coating of claim 1, wherein the self healing section prevents internal oxidation of a fiber matrix interphase covered by the self-healing section.

* * * * *